（12） United States Patent
Bishop et al.

(10) Patent No.: US 6,219,813 B1
(45) Date of Patent: Apr. 17, 2001

(54) PROGRAMMABLE TIMING CIRCUIT FOR TESTING THE CYCLE TIME OF FUNCTIONAL CIRCUITS ON AN INTEGRATED CIRCUIT CHIP

(75) Inventors: James W. Bishop, Newark Valley, NY (US); George A. Fax, Round Rock, TX (US); Robert G. Iseminger, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/106,959

(22) Filed: Jun. 29, 1998

(51) Int. Cl.⁷ .................................................. G06F 11/00
(52) U.S. Cl. ............................... 714/736; 714/733
(58) Field of Search .................... 714/736, 724, 714/733, 26, 719; 327/158, 277, 270; 365/201; 381/66

(56) References Cited

U.S. PATENT DOCUMENTS

| | | | |
|---|---|---|---|
| 3,794,766 | * | 2/1974 | Cox et al. ............................... 381/66 |
| 4,620,302 | | 10/1986 | Binoeder et al. ........................ 371/1 |
| 4,796,259 | | 1/1989 | Troy ........................................ 371/20 |
| 4,893,072 | | 1/1990 | Matsumoto ........................... 371/223 |
| 5,003,256 | | 3/1991 | Merrill ............................... 324/158 R |
| 5,039,939 | | 8/1991 | Dick et al. ......................... 324/158 R |
| 5,206,861 | | 4/1993 | Hannon et al. ...................... 371/22.3 |
| 5,212,443 | | 5/1993 | West et al. ......................... 324/158 R |
| 5,235,566 | | 8/1993 | Merrill ................................... 368/113 |
| 5,444,406 | * | 8/1995 | Horne .................................... 327/277 |
| 5,621,739 | * | 4/1997 | Sine et al. ............................. 714/724 |
| 5,651,013 | | 7/1997 | Iadanza ................................ 371/22.3 |
| 5,880,612 | * | 3/1999 | Kim ...................................... 327/158 |
| 5,923,676 | * | 7/1999 | Sunter et al. ......................... 714/733 |
| 5,936,977 | * | 8/1999 | Churchill et al. ....................... 714/26 |
| 5,959,487 | * | 9/1999 | Kawamura ............................ 327/270 |
| 5,982,681 | * | 11/1999 | Schwarz ............................... 365/201 |
| 5,996,097 | * | 11/1999 | Evans et al. .......................... 714/719 |
| 6,046,620 | * | 4/2000 | Relph ................................... 327/277 |

* cited by examiner

*Primary Examiner*—Albert DeCady
*Assistant Examiner*—David Ton
(74) *Attorney, Agent, or Firm*—Shelley M Beckstrand (57) ABSTRACT

A programmable timing circuit on an integrated circuit chip for testing the cycle time of functional circuits on the chip. The timing circuit includes a selectable input having at least two sources, one of which is a toggle circuit; a minimally delayed control path including a control latch; a programmable delay path in parallel with the control path and including a sample latch; and a comparator for comparing the state of the control latch and sample latches to provide a signal indicative of the delay path being longer than the control path. A plurality of configuration latches and multiplexers are provided for selecting the input source and routing an input signal through specific delay blocks to control the amount of delay in the delay path.

2 Claims, 6 Drawing Sheets

| FIG. 4A | FIG. 4B | FIG. 4C |

PROGRAMMABLE TIMING CIRCUIT FOR TESTING THE CYCLE TIME OF FUNCTIONAL CIRCUITS ON AN INTEGRATED CIRCUIT CHIP

BACKGROUND OF THE INVENTION

1. Technical Field of the Invention

This invention relates to an apparatus and method for testing the cycle time of functional circuits. More specifically, it relates to an on-chip programmable timing circuit for determining the relative performance of functional circuits and to verify chip circuit performance.

2. Background Art

Circuit speeds, i.e., the speed at which logic devices can switch combined with signal transmission rate from device to device, are not identical in all parts of the wafer (or from wafer to wafer) because of uncontrollable inconsistencies in the manufacturing process.

A common method for determining the performance of circuitry on an ASIC chip, after fabrication of the wafer, is through the use of Performance Scan-Ring Oscillators (PSROs). A PSRO circuit is essentially a free-running ring of memory elements passing a pulse (a la a bucket-brigade) the output of which can be measured at a reserved chip output pin. Free-running in this case implies a circuit that is not clocked externally, and will run as fast as the signals can propagate through the logic, i.e., limited only by the capabilities of the technology and manufacturing process variations. The periodicity of the PSRO output provides a relative indication of circuit speed, i.e., shorter period means faster circuit speed. PSROs are used to gauge the quality of the fabrication process, determine the speed of the circuitry on various parts of the wafer, and thereby grade the performance of individual chips on the wafer, before and after dicing. There is usually more than one PSRO on a large ASIC so that process variation within the chip can be taken into account.

PSRO timings are used by manufacturing to sort chips so they can be packaged under separate part numbers according to circuit speed. After the chips are packaged (mounted on module substrates), PSROs may no longer be accessible for re-verification, depending on the design. Development engineering for the ASIC must determine, through a combination of mathematical models and actual testing of the hardware under stress conditions, the relationship between PSRO value and the maximum clock rate at which the ASIC can reliably run, a process called Hardware-Based Cycle-Time (HBCT) analysis. This relationship is combined with other factors to establish the PSRO value(s) used for sorting the chips, i.e., sort point(s).

It is becoming common practice to include HBCT analysis in the determination of sort points since sole reliance on mathematical models based on technology parameters tends towards the conservative resulting in somewhat lower chip yields. Sort points must be established prior to the initiation of mass production, making the timeliness of HBCT analysis critical. With current HBCT methodology, the accumulation and analysis of data is difficult and time consuming.

A circuit path is a combination of logic gates and other devices with interconnecting conductors (transmission lines), as in a logic tree, such that activation or deactivation of an input (at the tip of a branch) can propagate through the tree, when other branches are properly conditioned, to control the output (at the base of the tree). A path usually begins at the output of one latch (or SRAM, GRA, or chip input receiver) and ends at the input of another latch (or SRAM, GRA, or chip output driver).

Path length refers to the time it takes for a polarity change at the input of a path to effect a polarity change at the output. A long path may also be referred to as a slow path.

Cycle time refers to the timing of the clock pulses that pace the operation of the ASIC. It is the elapsed time from the leading edge of one clock pulse to the leading edge of the next pulse of the same clock signal. It might also be stated as a frequency in which case the time from pulse to pulse is implied and can be calculated. Generally speaking, the cycle time must be somewhat longer than the length of the longest path in a design.

Current practice involves finding the longest, i.e., slowest, functional circuits (paths) in the design which are the determinants of the fastest cycle time at which a chip will run. The longest paths are then exercised while increasing the clock frequency, under controlled and/or measured temperature and voltage conditions, until a failure is produced. The major objective is to draw a correlation between fastest cycle time that the chip will run without failing and its measured PSRO time.

During the design of the chip, software based timing tools (mathematical models) are used to calculate the lengths of each path in the design using technology-based parameters. The chip design is greatly influenced by path length calculations since one of the objectives of the design is to produce chips that will operate at (or better than) specific clock frequencies needed to attain compute-performance requirements. It often happens that paths identified as longest by the software timing tools are not necessarily the longest in the actual hardware, if for no other reason than because of "disturb" effects of other circuits which are not factored into the timing calculations.

Long paths that are identified using software timing tools are often very difficult to activate in the actual hardware to allow measurement of the actual path length, particularly if it is not the longest path of the design. In one type of approach, the logic designer must write a unique "targeted" test case that precisely sets up the conditions to cause the object path to be activated. Another requirement of the test case is that failure of the object path must be readily detectable as the clock cycle is gradually shortened.

When the actual hardware is available, it is normally easier and more effective to identify the longest paths through "brute force" testing, although there are drawbacks to this method. For example, a vast array of functional tests, that have been developed to verify the logical integrity of the design, are executed on the hardware at accelerated cycle times during which voltage levels and temperature are recorded. Failures that occur must be analyzed to determine the specific circuit path failing, and whether this path is failing because of its length or other contributing factors. Usually the logic designer will be able to identify the failing path without much difficulty, if the software timing tool has also identified it as a long path. On the other hand, it may require weeks of analysis, depending on the nature of the failure, and then it may only be an educated guess.

The results are typically analyzed in chart form showing the relationship between PSRO value and fastest passing cycle times. The data points must be categorized by type of test performed, and normalized to correct for voltage and temperature deviations.

It is also a goal of HBCT activities to determine how chip fabrication process variations might affect the performance of certain types of circuits as compared to others, e.g., SRAMs, dense/complex logic, long wiring paths, and so forth. With current HBCT techniques it is very difficult to single out a path having the specific characteristics needed for this type of analysis, and be able to make measurements under dynamic conditions.

As previously mentioned, PSRO timings are used by manufacturing to sort chips so they can be packaged under separate part numbers according to circuit speed. Typically, PSRO values are measured and recorded under controlled voltage and temperature conditions before the wafer is diced. Once the chips are mounted on module substrates (chip carriers), these particular PSROs outputs may no longer be accessible for subsequent measurements, i.e., no connection is made between chip I/O pad and a module pin so as to minimize the number of module pins, module size, and thereby cost. This is well and good in the world where mistakes never happen, but experience has been the motivation for some ASIC designs to include additional PSRO circuits and have their outputs connected to module pins so that PSRO values may be re-checked. This capability is of great value during HBCT activities, and also in situations where an error is thought to be caused by a marginal timing condition, perhaps due to a part number mix-up between fast and slow chips, and a simple measurement of the PSROs could bolster the conclusion.

It is an object of the invention to provide an on-chip test circuit for facilitating HBCT activities.

It is a further object of the invention to provide for improved HBCT analysis in the determination of sort points.

It is a further object of the invention to provide an improved capability for testing functional circuits on integrated circuit chips following dicing and mounting of the chips to substrates.

It is a further object of the invention to provide a functional circuit testing capability not requiring test equipment external to the chip containing said circuit.

It is a further object of the invention to provide for programmable configuration of delay on data tapped directly from a functional circuit on an integrated circuit chip.

It is a further object of the invention to provide for circuit timing measurements under dynamic conditions which allow measurement of the actual path length, particularly if the circuit being measured is not the longest path of the chip design.

It is a further object of the invention to provide for circuit timing measurements on functional logic paths having desired characteristics for evaluating chip fabrication process variations which might affect circuit performance It is a further object of the invention to provide a functional circuit timing measurement circuit which taps directly off of a selected functional path, without adding logic to a possible critical path.

It is a further object of the invention to provide for ready detection of failure of an object path as its clock cycle is gradually shortened.

It is a further object of the invention to provide a capability to test any functional logic path, not just logic associated with buffers.

SUMMARY OF THE INVENTION

In accordance with the apparatus of invention, a programmable timing circuit is provided on an integrated circuit chip for testing the cycle time of functional circuits on said integrated circuit chip. The timing circuit includes a selectable input; a minimally delayed control path including a control latch; in parallel with said control path, a programmable delay path including a sample latch; and a comparator for comparing the state of said control latch and said sample latch to provide a signal indicative of said delay path being longer than said control path.

In accordance with the method of the invention, a method for testing the cycle time of a functional circuit on an integrated circuit chip, comprising the steps of applying clock pulses at the operational frequency of said functional circuit to said functional circuit and to a delay path tapped off said function circuit; clocking an input signal to said functional circuit and to said delay path; latching said input signal at the output of said functional circuit; latching said input signal at the output of said delay path; varying the delay in said delay path; and detecting when said input signal arrives at the output of said delay path too late to be latched by a next transition of said clock.

Other features and advantages of this invention will become apparent from the following detailed description of the presently preferred embodiment of the invention, taken in conjunction with the accompanying drawings.

BEST MODE FOR CARRYING OUT THE INVENTION

The objective of Hardware-Based Cycle-Time (HBCT) activities is to establish, through functional testing of the real hardware (the fabricated chips), the actual speed (cycle time) at which the chip is capable of functioning, with the goal of increasing the yield of fast chips and usable chips from wafer lots. Greater yields result in lower chip costs.

In accordance with the preferred embodiment of the invention, a multipurpose on-chip programmable timing circuit is provided that can be used to determine the relative performance of circuits of one chip as compared to others, and to facilitate the evaluation of circuit timing performed by development engineering in their HBCT activities. The configuration and results latches of the timing circuit are accessible via the maintenance serial scan chains (e.g., IEEE 1149.1 JTAG scan interface), and/or, if desired, may be incorporated in program accessible register bits, e.g., in diagnostic registers. By placing multiple copies of the circuit on a single ASIC, the effect of manufacturing process variations in different areas of the chip and on different types of circuits, e.g., built-in static memory arrays (SRAMs), Growable Register Arrays (GRAs), dense/complex logic, and high R/C paths, can be evaluated.

While not a complete solution to the problems described, the on-chip programmable timing circuit of the preferred embodiment provides features that can simplify and enhance HBCT activities, as well as provide a capability to verify, without necessity of specialized test equipment, that chip circuit performance is within specific limits.

Figure 1:
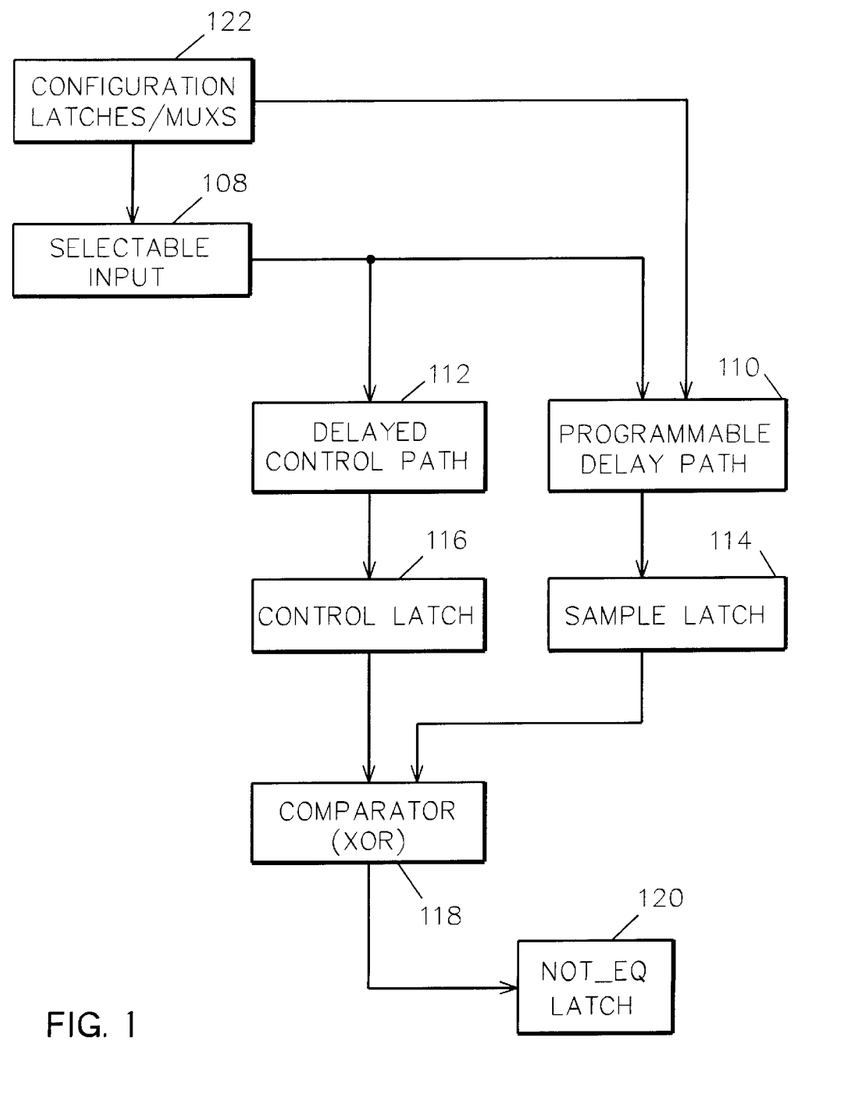
FIG. 1 is a high level block diagram of the on-chip programmable timing circuit of the invention.

Referring to FIG. 1, the programmable timing circuit of the preferred embodiment of the invention includes selectable input 108 having two or more sources, one of which is a toggle circuit; a programmable delay path 110 in parallel with a minimally delayed control path 112, respective sample latch 114 and control latch 116; a comparator 118 of sample latch 114 and control latch 116 outputs, and a latch 120 to capture the "Not Equal" output of the comparator (XOR) 118. Configuration latches 122 are initialized with values that condition multiplexers (MUXes)so as to select the input source 108 and "route" the input signal through specific delay blocks thereby controlling the amount of delay in the delayed path 110.

The basic objective of the circuit is to indicate when the delayed path 110 is longer than the cycle time of the ASIC. This is accomplished by comparison of the sample latch 114, which is set from the delayed path 110, with the control latch 116, which is always set to the correct state. If latches 114, 116 have opposite states during any cycle, a comparator latch, i.e., not equal (Not_Eq) latch, 120 is set providing the indication. Since setting of the latches is timed and gated by the clock pulses, the clock (not shown) must be running at the operational frequency.

Figure 2:
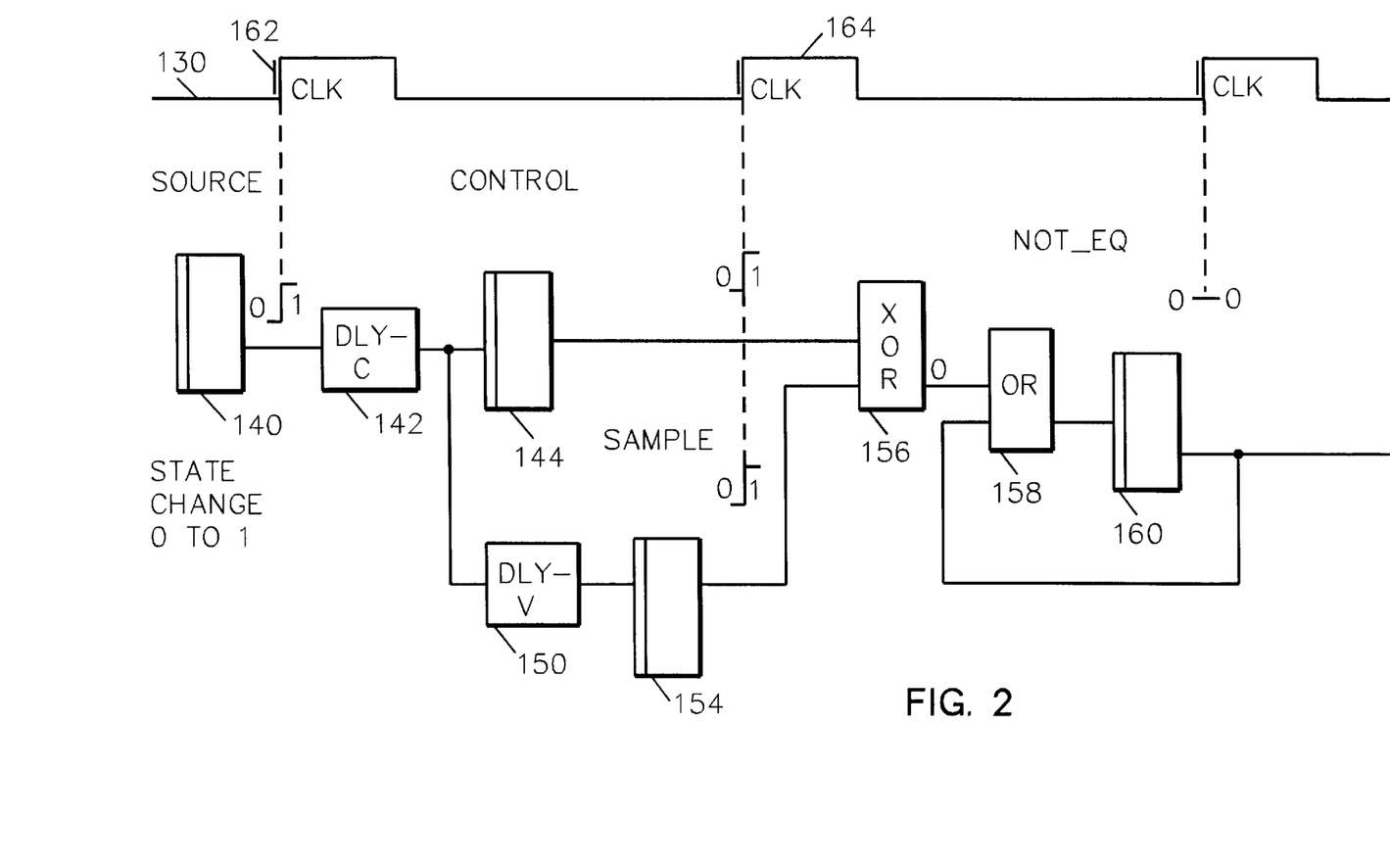
FIGS. 2 and 3 are linear graph conceptual representations of the programmable timing circuit of the invention illustrating the effect of varying delay within a delay path tapped off of a control path.
Figure 3:
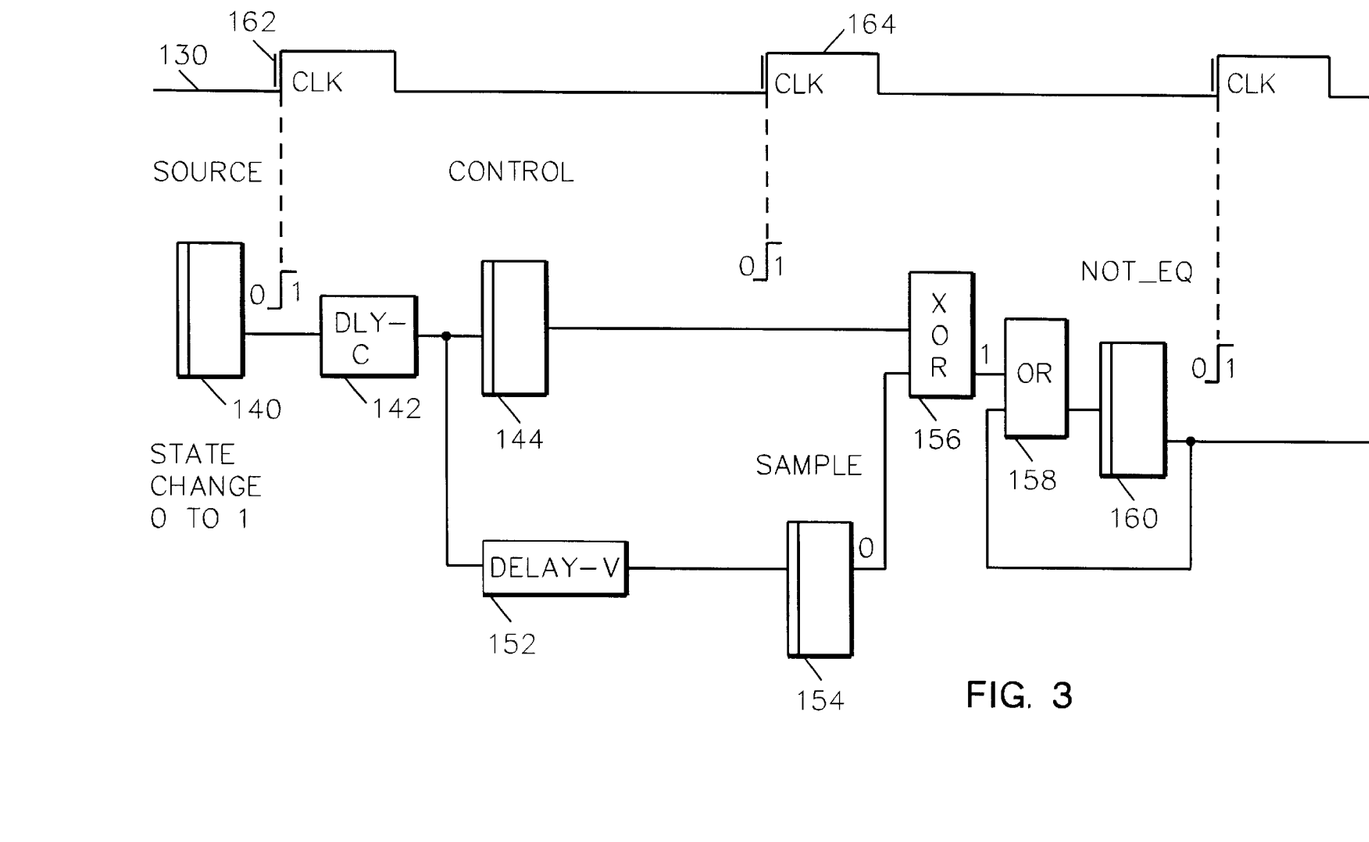

Referring to FIGS. 2 and 3, the relationship of clocking to the logic circuits is shown in a kind of linear graph format that presents a conceptual representation of the programmable timing circuit of the invention.

In a conceptual representation of the programmable timing circuit of the invention, source latch 140 output is fed to delay circuit 142, the output of which is fed to control latch 144 and variable delay logic 150. The output of variable delay 150 is fed to sample latch 154. The outputs of control latch 144 and sample latch 154 are fed to XOR comparator 156, the output of which is fed to OR circuit 158 and thence to NOT_EQ latch 160. The other input to OR 158 is the output of latch 160. The vertical bar 162 to the left of each clock 130 pulse represents the latest possible time, i.e., latch setup time, that a transition may occur to make the next pulse.

In operation, the circuits of FIGS. 2 and 3 differ in the value of the variable delay (Delay-V block) 150, 152 configured. These figures demonstrate the effect of increasing the variable delay value (Delay-V) 152 to the point where the 0-to-1 transition output from the SOURCE latch 140 takes too long to get to the SAMPLE latch 154 input before the next clock pulse 164. Source latch 140 in these diagrams represents a memory element with a timed output, i.e., corresponding to the Toggle Latch or functional signal input to the circuit (see MUX-I in FIG. 4A). Delay-C block 142 represents a circuit delay that is common to both the control latch 144 path and the sample latch 154 paths. FIG. 2 depicts the delay (or path length) from the source latch 140 to the sample latch 154 input being less than one clock cycle, and FIG. 3 depicts the delay being longer than one clock cycle which results in Not_Eq latch 160 being set. The vertical bar to the left of the clock pulse represents the latest possible time, i.e., latch setup time, that the transition may occur to make the next pulse.

Figure 4:
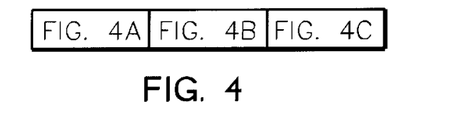
FIGS. 4A through 4C, configured as illustrated in FIG. 4, are a more detailed block diagram of a preferred embodiment of the on-chip programmable timing circuit of the invention.
Figure 4A:
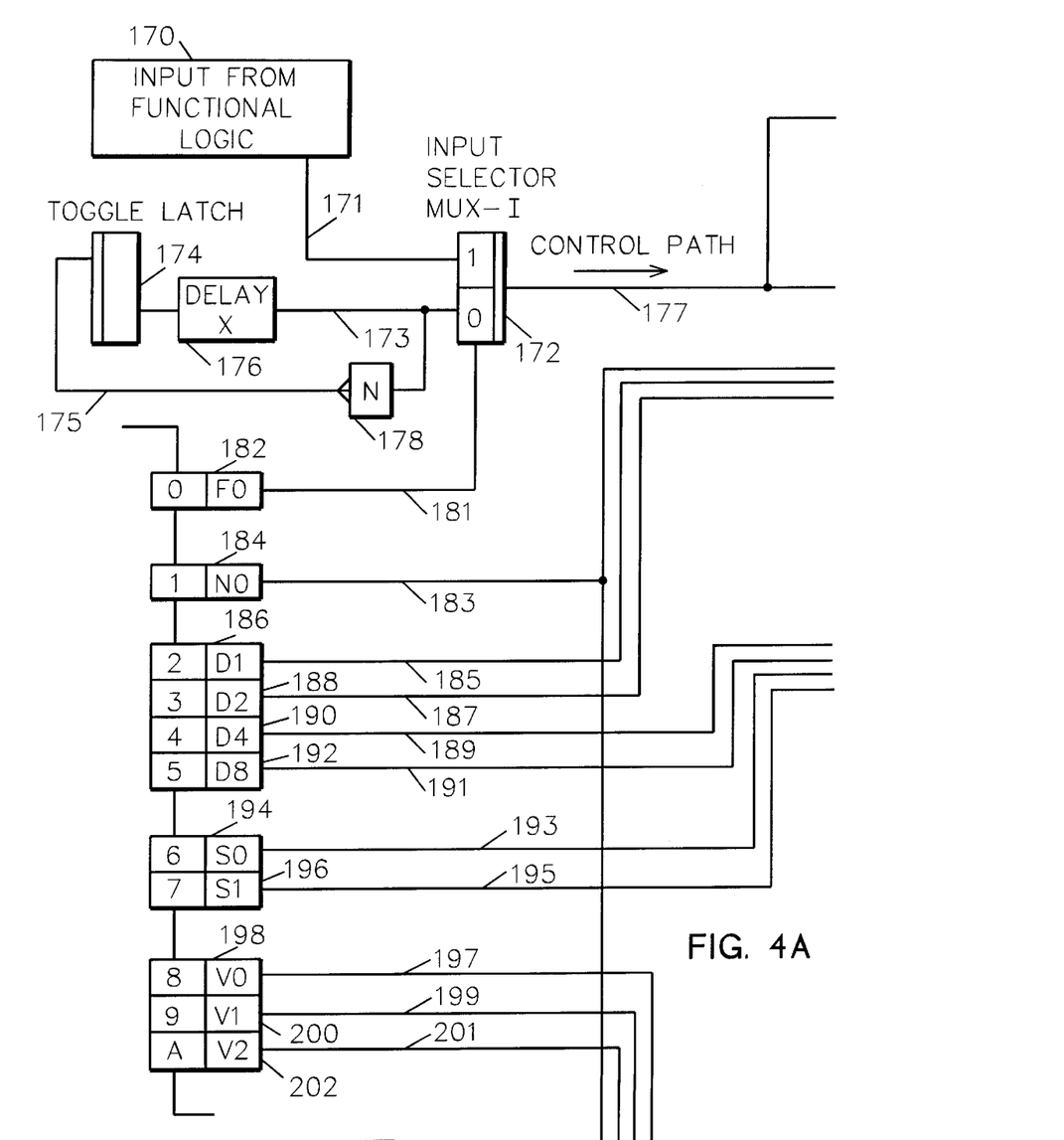
Figure 4B:
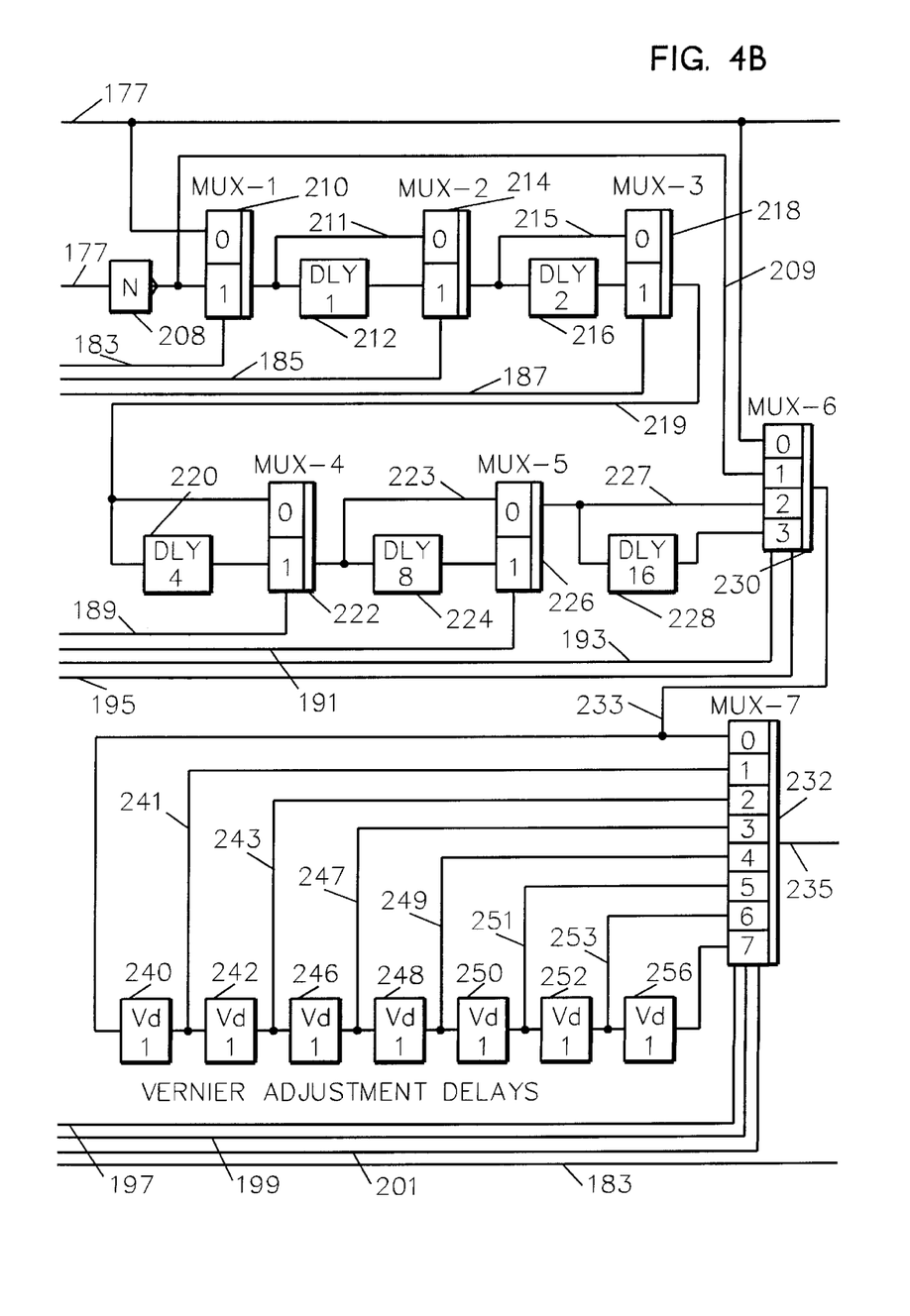
Figure 4C:
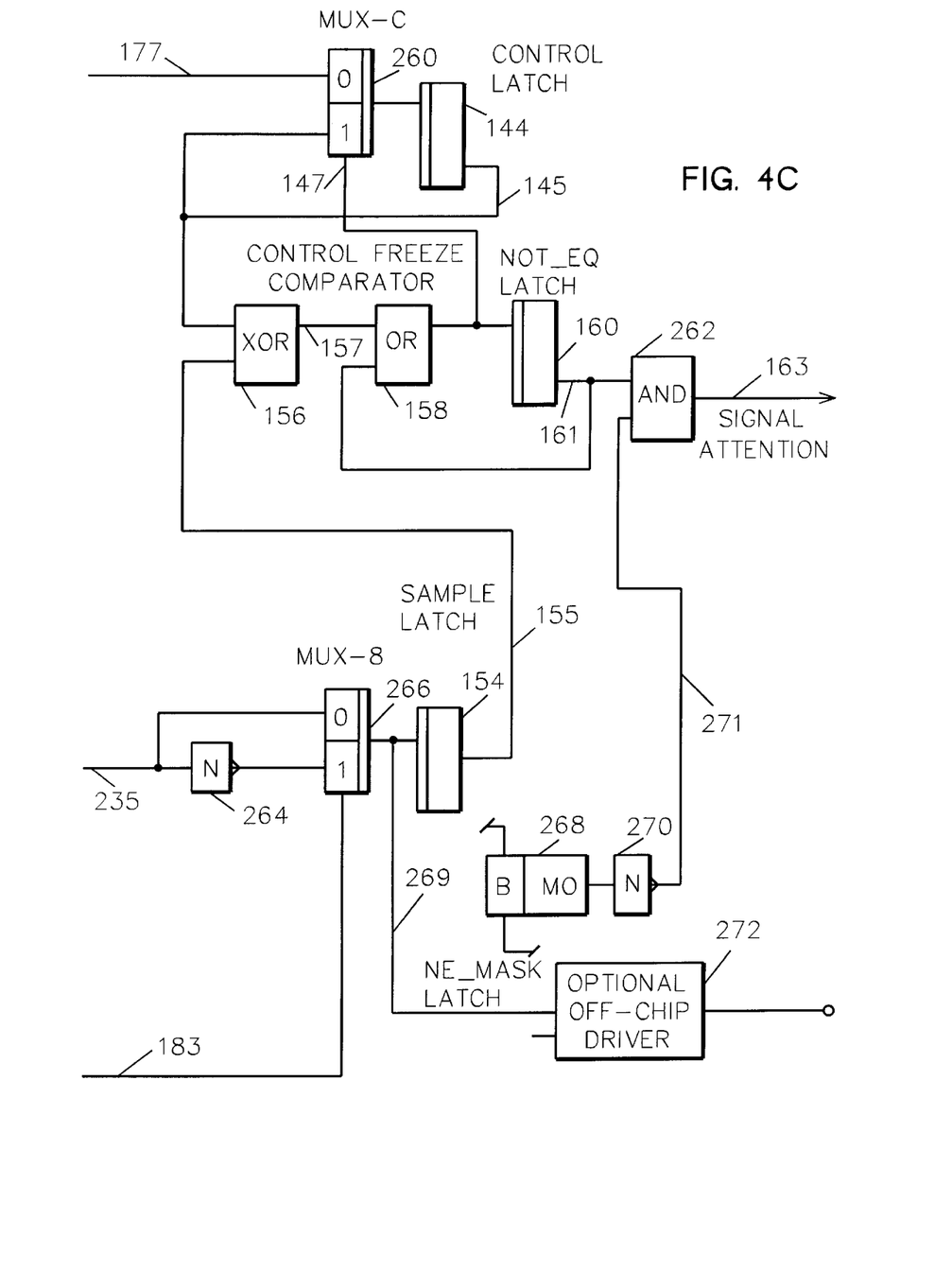

Referring to FIGS. 4A through 4C, the logic components used are typical of ASIC technology. Input from functional logic block 170 output represented by line 171 is fed to input selector multiplexor (MUX) 172. Toggle latch 174 output is fed through delay 176 on line 173 to MUX 172 and back through inverter 178 on line 175 to latch 174 input. The output of MUX 172 is fed on control path line 177 to MUX 260 and through inverter 208 on line 209 to MUX 210 and MUX 230, and to the 0 inputs of MUX 210 and MUX 230.

Configuration latches 180 include F0 182, the output of which is fed on line 181 to MUX 172; N0 184, the output of which is fed on line 183 to MUX 210 and MUX 266; D1 186, the output of which is fed on line 185 to MUX 214; D2 188, the output of which is fed on line 187 to MUX 218; D4 190, the output of which is fed on line 189 to MUX 222; D8 192, the output of which is fed on line 191 to MUX 226; S0 194, the output of which is fed on line 193 to MUX 230; S1 196, the output of which is fed on line 195 also to MUX 230; V0 198, V1 200 and V2 202, the outputs of which are fed on lines 197, 199 and 201, respectively, to MUX 232; and M0 (also referred to as the NE_MASK latch) 268, the output of which is fed to inverter 270 and thence on line 271 to AND gate 262.

The output of MUX 210 is fed on line 211 directly, and through delay 212, to MUX 214. The output of MUX 214 is fed on line 215 directly, and through delay 216, to MUX 218. The output of MUX 218 is fed on line 219 directly, and through delay 220, to MUX 222. The output of MUX 222 is fed on line 223 directly, and through delay 224, to MUX 226. The output of MUX 226 is fed on line 227 directly, and through delay 228, to MUX 230. The output of MUX 230 is fed on line 233 to MUX 232 position 0, and to vernier adjustment delay (Vd1) 240. The output of VD1 240 is fed on line 241 to Vd1 242 and MUX 232 position 1. Similarly, the outputs of Vd1 242, 246, 248, 250, and 252 are fed on lines 243, 247, 249, 251, 253, respectively, to successive MUX 232 positions 2 through 6, and to the next successive Vd1 246, 248, 250, 252 and 256. The output of VD1 256 is fed to MUX 232 position 7.

The output of MUX 232 is fed on line 235 to the zero input of MUX 266 and through inverter 264 to MUX 266, the output of which is fed on line 269 to sample latch 154 and, optionally, to off-chip driver 272. The output of MUX 260 is fed to control latch 144, the output of which is fed on line 145 back to MUX 260 and to comparator 156, the other input to which is the output of sample latch 154 on line 155. The output of comparator 156 is fed on line 157 to OR gate 158, the output of which is fed to NOT_EQ latch 160 and as a control freeze signal on line 147 to MUX 260. The output of latch 160 is fed on line 161 to AND gate 262 and back to OR gate 158. The output of AND gate 262 is signal attention line 163.

In operation, functional latches 174, 144, 154, 160 and configuration latches 180, 268 must be accessible as will be specified hereafter through a maintenance interface, e.g., serial scan-rings, and/or through program accessible bits/ registers. As used herein, program accessible bits/registers are addressable register bits that may reside in the processor chip on which a controlling program could be executed, or in an attached chip which is also accessible by the program, e.g., a memory controller or an interface bridge.

Functional latches toggle 174, control 144, sample 154, and NOT_EQ 160 must be clocked by the functional (system) clock 164 (see FIG. 2). The should be write accessible or at least resettable, and control 144 and NOT_ EQ 160 latches should also be read accessible in some form or another.

Toggle latch 174 switches states every clock cycle thus providing a built-in source for the timing circuit of FIG. 4. Control latch 144 follows the state of the source on line 171 one cycle later to provide the valid state on line 145 for comparison with the output of sample latch 154 on line 155. In the event of a not equal condition (true, or valid, output from XOR comparator 156 on line 157), the valid state will be held in control latch 144 by the control freeze signal on line 147.

Sample latch 154 is input from the delayed source signal 171. If the delayed path (including delays 212, 216, 220, 224, and 228) is configured short enough by configuration latches 180, latch 154 will follow the state of source 171 one cycle later in which case latch 154 will be the same state as control latch 144. If the delayed path is too long, sample latch 154 will capture the previous state of source 171 which will be different if source 171 has switched states.

Not_Eq latch 160 captures and holds the "not equal" output from comparator 156, and holds the control freeze signal 147 active to the control latch input MUX 260. Depending on the application, the active output 161 of latch 160 may be propagated as an attention or error signal 163.

Static latches, including configuration latches 180 and NE_mask latch 268, must hold their inputs at a steady state during operation. Their function is strictly to condition MUX input selection and, in the case of latch 268, to enable AND gate 262 to gate attention signal 161, 163.

Multiplexers used in the preferred embodiment of the circuit of the invention may be constructs of unit logic, "canned" macros, or a combination of both. Such MUXes are preferably balanced, i.e., have substantially or nearly equal circuit delay on each path of the same MUX. If, however, there is a short path through the MUX, the non-delayed path should be wired to its input.

MUX-I 172 is the input selector, and, although shown as a 2-way multiplexor, could actually be implemented in the timing circuit with more than two inputs 171, 173, depending on the number of functional circuits to be measured.

MUX-1 210 and MUX-8 266 are both 2-way multiplexers that are used to invert the entire delayed path as an experimental feature to counteract possible delay path imbalance.

MUX-2 214, MUX-3 218, MUX-4 222 and MUX-5 226 are used to individually route the delay path signal through delay blocks 216, 220, 224 and 228, respectively, or bypass them.

MUX-6 230 is a four-way multiplexer used to shorten the delayed path by selecting either 0 or 1 inputs by bypassing MUXes 210, 214, 218, 222 and 226. MUX-6 230 input 1 is selected for the inverted signal on line 209. MUX-6 230 inputs 2 and 3 are selected to bypass or include delay-16 228.

MUX-7 232 is an eight-way multiplexer used to bypass all or include one to seven Vernier adjustment delay blocks Vd1 240 . . . in the delayed path.

MUX-C 260 provides the capability to hold (or freeze) the state of control latch 144 when control freeze signal 147 is active.

The delay blocks used in the preferred embodiment of the circuit of the invention may be constructs of unit logic, "canned" macros, or a combination of both. It is advisable to design or select delay circuits that minimize pulse shrinkage or spreading, and are relatively consistent within a process, i.e., each usage of the same block type on the same chip should produce a similar delay.

Delay-X 176 is used to delay the output of toggle latch 174 to perhaps 30 to 60 percent of the nominal clock cycle. This, in effect, reduces the number and/or size of variable delay blocks required in the programmable timing circuit design.

Delay blocks 212, 216, 220, 224, and 228 and associated MUXes 210, 214, 218, 222, and 226, respectively, provide "course" adjustment of the variable delay. Delay values of delay blocks 216, 220, 224, 228 are relative in time to delay 212, i.e., multiples of the time delay value of delay 212, not necessarily multiple copies of delay 212. Actual delay values selected should allow adjustment of the delay path by about 60 percent of the nominal clock cycle.

Vernier delays Vd1 240 . . . should all have the same delay value. Their purpose is to provide a "fine" adjustment to the delayed path to compensate for balance imperfections in the "course" delay adjustment (supra). The circuit design shown in this embodiment (with the 8-way MUX 232) should provide eight fairly even increments of delay. The MUX delay times must be included in circuit delay calculations when designing the circuit.

Attention signal 163 may be connected into the exceptional condition or interrupt of the ASIC allowing the "not equal" condition out of latch 160 to signal a system or program interruption.

Optional off-chip driver 272 is a test output that can be monitored with an oscilloscope to investigate source input signals and measure relative delays of circuits in the delayed path.

Table 1 provides a reference for programming the variable delay of the timing circuit shown in FIG. 4. In addition to valid delay configurations, it also shows two invalid setups that, if used, will force the "not equal" condition at latch 160. These invalid setups are useful for application code development and for diagnostics.

TABLE 1

DELAY PATH CONFIGURATION

| Path Invert | Delay Insert | | | | Delay Modify | | Vernier Adjust | | | Description-Remarks |
| --- | --- | --- | --- | --- | --- | --- | --- | --- | --- | --- |
| NO | D1 | D2 | D4 | D8 | S0 | S1 | V0 | V1 | V2 | |
| 0 | x | x | x | x | 0 | 0 | 0 | 0 | 0 | Shortest true |
| 0 | x | x | x | x | 0 | 0 | v | v | v | 0 to 7 vernier delay units |
| *0 | x | x | x | x | 0 | 1 | x | x | x | *Test mismatch (invalid combination) |
| 1 | x | x | x | x | 0 | 1 | 0 | 0 | 0 | Shortest with double-invert |
| 1 | x | x | x | x | 0 | 1 | v | v | v | 0 to 7 vernier delay with dbl-inv |
| *1 | x | x | x | x | 0 | 0 | x | x | x | *Test mismatch (invalid combination) |
| n | d | d | d | d | 1 | 0 | v | v | v | 0 to 15 delay units + 0 to 7 small delays |
| n | d | d | d | d | 1 | 1 | v | v | v | 16 to 31 delay units + 0 to 7 small delays |
| 0 | 1 | 1 | 1 | 1 | 1 | 1 | 1 | 1 | 1 | Longest true |
| 1 | 1 | 1 | 1 | 1 | 1 | 1 | 1 | 1 | 1 | Longest with double invert |

TABLE 1-continued

DELAY PATH CONFIGURATION

| Path Invert | Delay Insert | Delay Modify | Vernier Adjust | |
|---|---|---|---|---|
| NO | D1 D2 D4 | D8 S0 S1 | V0 V1 V2 | Description-Remarks |

Legend:
x Don't care
n '0' = true, or '1' = double-invert true
d '0' or '1', inserts corresponding delay value into path
v v v '000' thru '111' include 0 to 7 small delay blocks Referring to Table 2, a timing chart illustrates HBCT methodology and application of the timing circuits of the preferred embodiment of the invention to a hypothetical ASIC design to enhance HBCT activities.

The Clock signal at Table 2, line 5 is drawn at the 100% of cycle time point on the scale. The additional corner marks at lines 7 and 8 surrounding the clock pulse on line 5 signify how the cycle time might be varied during HBCT testing to trigger a failure on the longest paths in the design. Using this method it is very difficult to collect data on other than a few of the longest paths because of limited success in masking or ignoring these errors to measure slightly shorter paths. To improve this situation, the programmable timing circuit of the preferred embodiment of the invention provides the capability to single out specific types of circuits, e.g., SRAM, complex logic, long wiring paths, etc., to contribute additional data points for analysis.

Input Selector MUX-I 172 can be configured to route a functional logic signal 171 into the timing circuit. This signal must, of course, be chosen during the design of the chip and physically wired into MUX 172. It should be chosen because of specific physical characteristics that are meaningful to HBCT analysis, and, in addition, should meet certain criteria: first, it must switch frequently under normal operating conditions, or be easily made to switch states (0-to-1 and 1-to-0); second, it must be a clocked signal in the same clock domain as the timing circuit; and, third, gating conditions for the signal should not control the timing of the signal (otherwise the gating signal would be timed).

In the timing chart of Table 2, the three functional paths, Path w/ SRAM at line 12, Complex Logic at line 16, and Long Wire Path at line 20 have corresponding delay circuit paths that are tapped off of them at lines 14, 18 and 22, respectively, via the Input Selector MUX-I 172. The delay circuits are configured so that they become the longest paths on the ASIC, and therefore are detectable at a slower clock rate than the longest functional paths. In other words, as the variable clock is speeded up (moving the clock pulse at 100 percent on line 5 towards the left), the delayed circuits 14, 18 and 22 will be detected before the longest functional paths produce errors. Alternatively, if a variable clock cannot be used, the programmable timing circuit delays can be increased incrementally (as shown by >>>> on lines 14, 18 22 and 24) until the respective Not_Eq latch 160 is set, thereby providing a relative value that can be compared against other ASICs" values.

The toggle latch 174 output 173 may also be selected to provide an additional data point per timing circuit and as a frame of reference. The input selector MUX-I 172 can be set to route the output 173 of the Toggle Latch 174 through the delay path (of FIG. 4B) to measure in the same manner previously described.

By way of summary, the programmable timing circuit of the preferred embodiment of the invention may be used for HBCT activities where a test case or exerciser, that ensures that the circuits under test will be switching states (preferably under operational conditions), is required.

If the measurement method employs a variable clock, the delay value for each timing circuit should be determined through experimentation (or by calculation) such that the total path is somewhat longer than the longest functional path in the ASIC; these values must remain constant for testing of all chips; the "Not_Eq boundary" cycle time is then determined by varying the clock frequency; and clock frequencies are used to determine the relative circuit performance of the chips tested.

If the measurement method does not employ a variable clock, the functional (system) clock must remain constant for all chips; the "Not_Eq boundary" is determined by varying the delay value for each circuit measured; delay values are used to determine the relative circuit performance of the chips tested.

There are situations where the capability to re-check or "screen" circuit performance of a chip without special test equipment can be very useful. This is especially true when different performance levels of the same chip design are designated as a difference in part number. Having more than one valid part number for the same physical part creates an exposure to having mixed stock in card and system manufacturing, which, in turn, can lead to highly intermittent errors and very expensive resolutions. The programmable timing circuit of the invention can be used as a screen when it is incorporated in the ASIC design such that it is accessible and controllable. To create a simple screen or "go/no-go" test, the timing circuit is configured to use the toggle latch 174 as a source, and the variable delay is set to a value that has been established to ensure that the circuit performance is within specification as long as Not_Eq latch 160 is never set during normal operation of the chip.

TABLE 2

TIMING CHART EXAMPLE

```
                                                                        1   1   1
     Percent of          1   2   3   4   5   6   7   8   9   0   1   2
     Cycle Time      0   0   0   0   0   0   0   0   0   0   0   0   0
                     :                                       :
                     :                                       :
 5   Clock            ⌐⌐____________________________________⌐⌐_______
 6                   :                                       :
 7   Corner Marks    :                              ⌐⌐⌐⌐⌐⌐⌐ : ⌐⌐ ⌐⌐
 8                   :                                       :
 9                   :                                       :
10   Longest Paths   |=======================================|
11                   :                                       :
12   Path w/SRAM     |SSSSSSSSSSSSSSSS==============================|
13   plus            :                  |                    :
14   Delay Ckt       :                  DDDDDDDDDDDDDDDDDDDDDDDDDDDDDDD|>>
15                   :                                       :
16   Complex Logic   |===W=====WW==========W==W==========WWWW==|
17   plus            :                                 |     :
18   Delay Ckt       :                                 DDDDDDDDDDD|> > >
19                   :                                       :
20   Long Wire Path  :==WWWWWW===WWWWWWWWWW===WWWWWWWWWWWWW===|
21   plus            :                                 |     :
22   Delay Ckt       :                                 DDDDDDDDDDD|>
23                   :                                       :
24   Toggle Path     :XXXXXXXXXXXXXDDDDDDDDDDDDDDDDDDDDDDDDDDDDDD>>>>>
25                   :                                       :

26   Legend:  = = = =   = non-specific
27            WWWW      = wire delay
28            > > > >   = adjustment
29            S S S S   = SRAM delay
30            D D D D   = delay circuit
31            X X X X   = Fixed Delay-X
32
```

ADVANTAGES OVER THE PRIOR ART

It is an advantage of the invention that an on-chip test circuit is provided for facilitating HBCT activities.

It is a further advantage of the invention that an improved method for HBCT analysis in the determination of sort points is provided.

It is a further advantage of the invention that there is provided an improved capability for testing functional circuits on integrated circuit chips following dicing and mounting of the chips to substrates.

It is a further advantage of the invention that there is provided a method and apparatus for gathering additional data in a more efficient manner than heretofore possible for HBCT analysis, as well as providing a "built-in" tool for measuring circuit performance without the need of additional test equipment.

It is a further advantage of the invention that there is provided a functional circuit testing capability not requiring test equipment external to the chip containing said circuit.

It is a further advantage of the invention that there is provided a programmable configuration of delay on data tapped directly from a functional circuit on an integrated circuit chip.

It is a further advantage of the invention that there is provided an apparatus and method for circuit timing measurements under dynamic conditions which allow measurement of the actual path length, particularly if the circuit being measured is not the longest path of the chip design.

It is a further advantage of the invention that there is provided an apparatus and method for circuit timing measurements on functional logic paths having desired characteristics for evaluating chip fabrication process variations which might affect circuit performance.

It is a further advantage of the invention that there is provided a functional circuit timing measurement circuit which taps directly off of a selected functional path, without adding logic to a possible critical path.

It is a further advantage of the invention that there is provided an apparatus and method for ready detection of failure of an object path as its clock cycle is gradually shortened.

It is a further advantage of the invention that there is provided a capability to test any functional logic path, not just logic associated with buffers.

Alternative Embodiments

It will be appreciated that, although specific embodiments of the invention have been described herein for purposes of illustration, various modifications may be made without departing from the spirit and scope of the invention. In particular, it is within the scope of the invention to provide a memory device, such as a transmission medium, magnetic or optical tape or disc, or the like, for storing signals for controlling the operation of a computer on a chip according to the method of the invention and/or to structure its components in accordance with the apparatus of the invention.

Accordingly, the scope of protection of this invention is limited only by the following claims and their equivalents.

We claim:

1. A programmable timing circuit on an integrated circuit chip for testing the cycle time of functional circuits on said integrated circuit chip, comprising:

a selectable input signal source, said source being a test point which may be passively sampled;

a minimally delayed control path for conveying to a control latch an expected polarity;

in parallel with said control path, a programmable sub-cycle delay path fed from said signal source and terminating at a sample latch; and a comparator for comparing the state of said control latch and said sample latch to provide a signal indicative of said delay path being longer than said control path.

2. The programmable timing circuit of claim 1, further comprising:

a plurality of selectable delay blocks within said delay path;

a plurality of configuration latches and multiplexers for selecting said input source and routing an input signal through specific delay blocks to control the amount of delay in said delay path.

* * * * *